(12) United States Patent
Hatsuda

(10) Patent No.: US 12,293,096 B2
(45) Date of Patent: May 6, 2025

(54) MEMORY SYSTEM

(71) Applicant: Kioxia Corporation, Tokyo (JP)

(72) Inventor: Kosuke Hatsuda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 270 days.

(21) Appl. No.: 17/939,848

(22) Filed: Sep. 7, 2022

(65) Prior Publication Data

US 2023/0297258 A1 Sep. 21, 2023

(30) Foreign Application Priority Data

Mar. 17, 2022 (JP) ................................ 2022-043060

(51) Int. Cl.
*G11C 11/00* (2006.01)
*G06F 3/06* (2006.01)
*G11C 11/16* (2006.01)

(52) U.S. Cl.
CPC .......... *G06F 3/0632* (2013.01); *G06F 3/0604* (2013.01); *G06F 3/0658* (2013.01); *G06F 3/0673* (2013.01); *G11C 11/1659* (2013.01); *G11C 11/1673* (2013.01); *G11C 11/1675* (2013.01)

(58) Field of Classification Search
CPC .... G06F 3/0632; G06F 3/0064; G06F 3/0658; G06F 3/0673; G11C 11/1659; G11C 11/1673; G11C 11/1675
USPC ....................................................... 365/158
See application file for complete search history.

(56) References Cited

U.S. PATENT DOCUMENTS

| | | | |
|---|---|---|---|
| 7,688,614 B2 | 3/2010 | Morimoto | |
| 8,064,262 B2 * | 11/2011 | Yamashita | G11C 16/349 365/210.11 |
| 8,717,840 B2 | 5/2014 | Higashi et al. | |
| 9,530,513 B1 * | 12/2016 | Pan | G11C 11/5628 |
| 10,529,433 B1 * | 1/2020 | Liikanen | G11C 7/18 |
| 10,642,510 B2 * | 5/2020 | Sharon | G06F 3/064 |
| 11,107,539 B2 * | 8/2021 | Sakumura | G06F 3/0679 |
| 11,854,623 B2 * | 12/2023 | Yu | G06F 12/0246 |
| 2006/0092689 A1 | 5/2006 | Braun et al. | |
| 2008/0098165 A1 | 4/2008 | Shinozaki et al. | |
| 2014/0082259 A1 | 3/2014 | Yeh | |
| 2016/0099052 A1 * | 4/2016 | Lee | G11C 11/1659 365/148 |

(Continued)

FOREIGN PATENT DOCUMENTS

| | | |
|---|---|---|
| JP | 4054347 B2 | 12/2007 |
| JP | 5624573 B2 | 10/2014 |

(Continued)

*Primary Examiner* — Viet Q Nguyen
(74) *Attorney, Agent, or Firm* — Holtz, Holtz & Volek PC

(57) ABSTRACT

A memory system includes a non-volatile memory and a memory controller configured to receive a command including an access target in the non-volatile memory and setting information from an external device and configured to control a writing operation or a reading operation to the access target. The memory controller has a condition setting circuit. The condition setting circuit is capable of performing the writing operation or the reading operation under a plurality of different conditions. The memory controller performs the writing operation or the reading operation under one of the plurality of different conditions selected by the condition setting circuit in accordance with the setting information.

11 Claims, 17 Drawing Sheets

(56) References Cited

U.S. PATENT DOCUMENTS

| | | | | |
|---|---|---|---|---|
| 2017/0270994 A1* | 9/2017 | Glancy | ............... | G11C 29/028 |
| 2019/0392907 A1* | 12/2019 | Her | ...................... | G06F 3/0659 |
| 2020/0402594 A1* | 12/2020 | Dak | ...................... | G11C 16/32 |
| 2021/0193231 A1* | 6/2021 | Luo | ...................... | G06F 3/0659 |
| 2022/0075538 A1* | 3/2022 | Kawabe | ................. | G11C 16/26 |
| 2023/0317152 A1* | 10/2023 | Kurosawa | ........... | G11C 11/5671 |
| | | | | 365/185.03 |

FOREIGN PATENT DOCUMENTS

| | | |
|---|---|---|
| TW | I467573 B | 1/2015 |
| TW | I483111 B | 5/2015 |

\* cited by examiner

FIG. 3

| | COMMAND | ADDRESS | POSITION | ... |
|---|---|---|---|---|
| WT | XXX(WT) | YYY | 0x*** | |

FIG. 9

|  | COMMAND | ADDRESS | SETTING | Temp. |
|---|---|---|---|---|
| WT | XXX0(WT) | YYY | S0 | X0 |
| WT | XXX1(WT) | YYY | S1 | X1 |
| WT | XXX2(WT) | YYY | S2 | X2 |
| WT | XXX3(WT) | YYY | S3 | X3 |

FIG. 10

|  | COMMAND | ADDRESS | SETTING | Time |
|---|---|---|---|---|
| WT | XXX0(WT) | YYY | S0 | T0 |
| WT | XXX1(WT) | YYY | S1 | T1 |
| WT | XXX2(WT) | YYY | S2 | T2 |
| WT | XXX3(WT) | YYY | S3 | T3 |

FIG. 11

|  | COMMAND | ADDRESS | SETTING | Count |
|---|---|---|---|---|
| WT | XXX0(WT) | YYY | S0 | N0 |
| WT | XXX1(WT) | YYY | S1 | N1 |
| WT | XXX2(WT) | YYY | S2 | N2 |
| WT | XXX3(WT) | YYY | S3 | N3 |

FIG. 12

|  | COMMAND | ADDRESS | SETTING | Feature |
|---|---|---|---|---|
| WT | XXX0(WT) | YYY | S0 | F0 |
| WT | XXX1(WT) | YYY | S1 | F1 |
| WT | XXX2(WT) | YYY | S2 | F2 |
| WT | XXX3(WT) | YYY | S3 | F3 |

D3

MEMORY SYSTEM

CROSS REFERENCE TO RELATED APPLICATIONS

This application is based upon and claims the benefit of priority from Japanese Patent Application No. 2022-043060, filed Mar. 17, 2022, the entire contents of which are incorporated herein by reference.

FIELD

An embodiment of the invention relates to a memory system with a storage device.

BACKGROUND

A memory system comprising a memory device (non-volatile memory) wherein memory elements are arranged in an array similar to the memory elements provided at intersections of wirings extending in different directions is known.

BRIEF DESCRIPTION OF DRAWINGS

FIG. 3 is a diagram showing an example of a request signal transmitted from a host in a memory system according to an embodiment.

FIG. 9 is a diagram showing an example of a request signal transmitted from a host in a memory system according to an embodiment.

FIG. 10 is a diagram showing an example of a request signal transmitted from a host in a memory system according to an embodiment.

FIG. 11 is a diagram showing an example of a request signal transmitted from a host in a memory system according to an embodiment.

FIG. 12 is a diagram showing an example of a request signal transmitted from a host in a memory system according to an embodiment.

DESCRIPTION OF EMBODIMENTS

Figure 1:
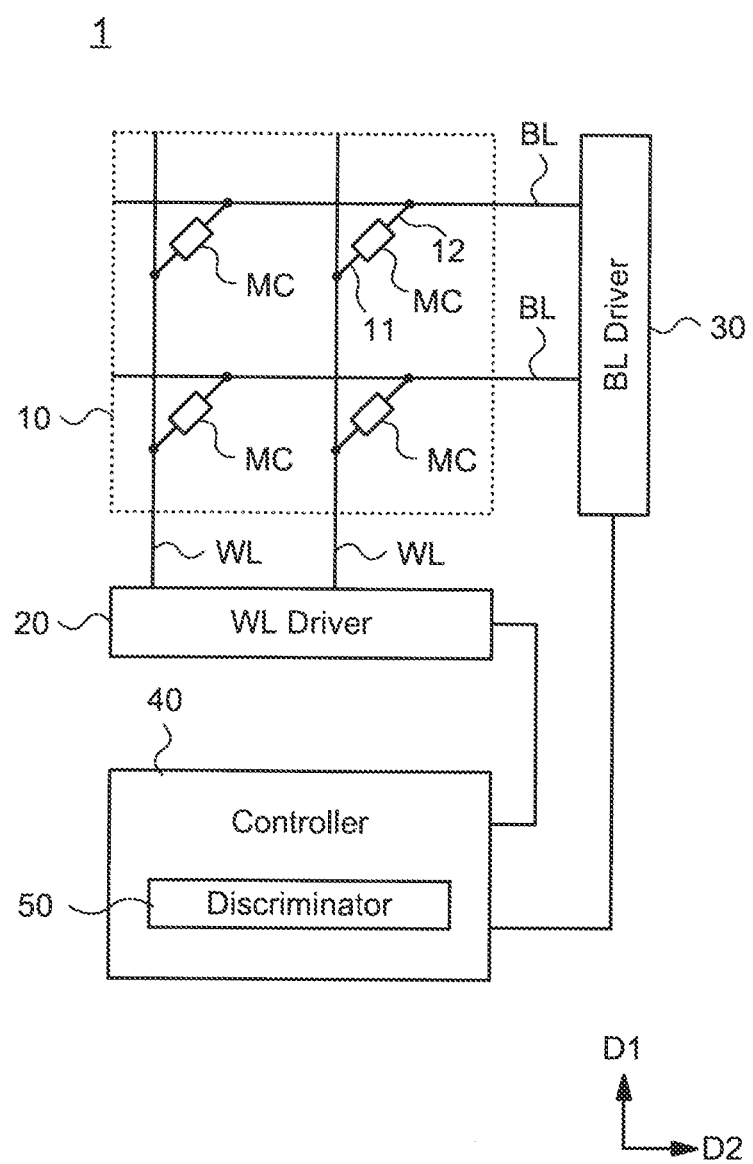
FIG. 1 is a block diagram showing an overall configuration of a memory system according to an embodiment.

A memory system which is capable of performing a read operation from a non-volatile memory and a writing operation to the non-volatile memory under a condition suitable for the operation indicated by a command or the like is provided.

A memory system according to an embodiment includes a non-volatile memory and a memory controller configured to receive a command including an access target in the non-volatile memory and setting information from an external device and configured to control a writing operation or a reading operation to the access target. The memory controller has a condition setting circuit. The condition setting circuit is capable of performing the writing operation or the reading operation under a plurality of different conditions. The memory controller performs the writing operation or the reading operation under one of the plurality of different conditions selected by the condition setting circuit in accordance with the setting information.

Hereinafter, a semiconductor memory system according to the present embodiment will be described in detail by referring to the drawings. In the following description, components having substantially the same functions and configurations are denoted by the same reference numerals, and will be described redundantly only when necessary. Each of the embodiments described below exemplifies a device and a method for embodying a technical idea of this embodiment. The technical idea of the embodiment is not specified by the materials, shapes, structures, arrangements, and the like of the components described below. Various modifications may be made to the technical idea of the embodiment in addition to the scope of the claims.

In each embodiment of the present disclosures, a direction from a word line WL toward a bit line BL is referred to as upper or above. On the contrary, a direction from the bit line BL toward the word line WL is referred to as lower or below. Thus, for convenience of explanation, although the phrase above or below will be used for explanation, for example, the word line WL and the bit line BL may be arranged so that the vertical relationship between them is opposite to that shown in the drawings. In the following description, for example, an expression "the bit line BL above the word line WL" only describes the vertical relationship between the word line WL and the bit line BL as described above, and other members may be arranged between the word line WL and the bit line BL. Above or below means a positional relationship of each layer in a structure in which a plurality of layers are stacked. In the case of the expression a bit line BL above a word line WL, it may be a positional relationship whereby the word line WL and the bit line BL do not overlap in a plan view. On the other hand, in the case of the expression a bit line BL vertically above a word line WL, it means a positional relationship whereby the word line WL and the bit line BL overlap in a plan view.

The expressions "a includes A, B, or C", "a includes any of A, B, and C", and "a includes one selected from a group consisting of A, B, and C" do not exclude the case where a includes a plurality of combinations of A to C unless otherwise specified. Furthermore, these expressions do not exclude the case where a includes other elements.

In the following description, although "voltage" refers to a potential difference between two terminals, "voltage" may refer to a potential with respect to a ground voltage or a voltage VSS.

1. First Embodiment

A memory system according to a first embodiment will be described with reference to FIG. 1 to FIG. 5. A memory system 1 according to the first embodiment includes, for example, a nonvolatile memory 10 in which a plurality of memory cells MC are arranged, and a memory controller 40 that controls the non-volatile memory 10.

1-1. Overall Configuration of Memory System

An overall configuration of the memory system according to the first embodiment will be described with reference to FIG. 1. FIG. 1 is a block diagram showing an overall configuration of a memory system according to an embodiment. As shown in FIG. 1, the memory system 1 includes the non-volatile memory 10, a word line driving circuit 20 (WL Driver), a bit line driving circuit 30 (BL Driver), and the memory controller (Controller).

The non-volatile memory 10 is provided with the plurality of memory cells MC, a plurality of word lines WL, and a plurality of bit lines BL. The word line WL extends in a direction D1. The bit line BL extends in a direction D2. The memory cell MC is provided between the word line WL and the bit line BL, and is electrically connected to the word line WL and the bit line BL. The memory cell MC is a two-terminal memory cell. A first terminal 11 of the memory cell MC is connected to the word line WL. A second terminal 12 of the memory cell MC is connected to the bit line BL. As will be described in detail later, the word line WL and the bit line BL intersect. A memory cell MC is provided at a position where the word line WL and the bit line BL cross each other in a plan view. The memory cell MC may be a three-terminal memory cell.

In FIG. 1, a configuration in which the D1 direction and the D2 direction are perpendicular is illustrated. However, the directions may intersect at an angle which the D1 direction is not perpendicular to the D2 direction. FIG. 1 illustrates a configuration in which the word line WL extends linearly in the direction D1. However, the word line WL does not have to be linear. The word line WL may extend in the direction D1 when the word line WL is viewed entirely. FIG. 1 illustrates a configuration in which the bit line BL extends linearly in the direction D2. However, the bit line BL does not have to be linear. The bit line BL may extend in the direction D2 when the bit line BL is viewed entirely.

By selecting one word line WL and one bit line BL from the plurality of word lines WL and the plurality of bit lines BL, respectively, the memory cell MC which is the target of the writing operation and the reading operation is designated. Specifically, by applying a predetermined voltage to a specific word line WL and bit line BL, a predetermined current flows in the memory cell MC. When the predetermined current flows in the memory cell MC, the writing operation and the reading operation with respect to the memory cell MC are performed.

The word line driving circuit 20 is provided at a position adjacent to the non-volatile memory 10 in the D1 direction. The word line driving circuit 20 selects one word line WL from the plurality of word lines WL connected to the word line driving circuit 20.

The bit line driving circuit 30 is provided at a position adjacent to the non-volatile memory 10 in the D2 direction. The bit line driving circuit 30 selects one bit line BL from the plurality of bit lines BL connected to the bit line driving circuit 30.

The memory controller 40 is connected to the word line driving circuit 20 and the bit line driving circuit 30. The memory controller 40 includes a discrimination circuit 50 (Discriminator). The memory controller 40 receives write and read requests from a host computer in communication with the host computer. The write request includes a write command, a write address, and write data. The read request includes a read command and a read address. When there is no need to distinguish between write and read commands, these are also referred to as a "command". The memory cell MC subject to the write request and the read request may be referred to as an "access target" in the non-volatile memory 10.

Although details will be described later, in the memory system 1 according to the present embodiment, operating conditions of the word line driving circuit 20 and the bit line driving circuit 30 are determined based on the "setting information" included in the command. That is, the memory controller 40 receives the command including the access target and the setting information in the non-volatile memory 10 from outside of the memory system 1, and controls the specified the writing operation or the reading operation to the access target based on the received signal. In the present embodiment, the operating conditions of the word line driving circuit 20 and the bit line driving circuit 30 are determined based on the setting information.

The memory controller 40 supplies control signals to the word line driving circuit 20 and the bit line driving circuit 30 according to the write address and the read address specified by the command. The word line driving circuit 20 and the bit line driving circuit 30 select the word line WL and the bit line BL corresponding to the specified addresses in accordance with the control signal, respectively, and apply a write voltage or a read voltage to the selected word line WL and the bit line BL, respectively. The write voltage or the read voltage is determined by an operating condition based on the setting information included in the command. In this manner, the writing operation or the reading operation to the memory cell MC is performed.

The discrimination circuit 50 discriminates the data value stored in the memory cell MC based on the voltage of the memory cell MC obtained by the reading operation. Although details will be described later, for example, the memory cell MC has a variable resistance element and a swing element connected in series. The memory cell MC stores data of two values according to a resistance state (a low-resistance state or a high-resistance state) of the variable resistance element according to the voltage applied to the memory cell MC or the current flowing through the memory cell MC. The discrimination circuit 50 discriminates the resistance state of the variable resistance element so that the determination of the data stored in the memory cell MC is performed.

1-2. Circuit Configuration of the Non-Volatile Memory 10

Figure 2:
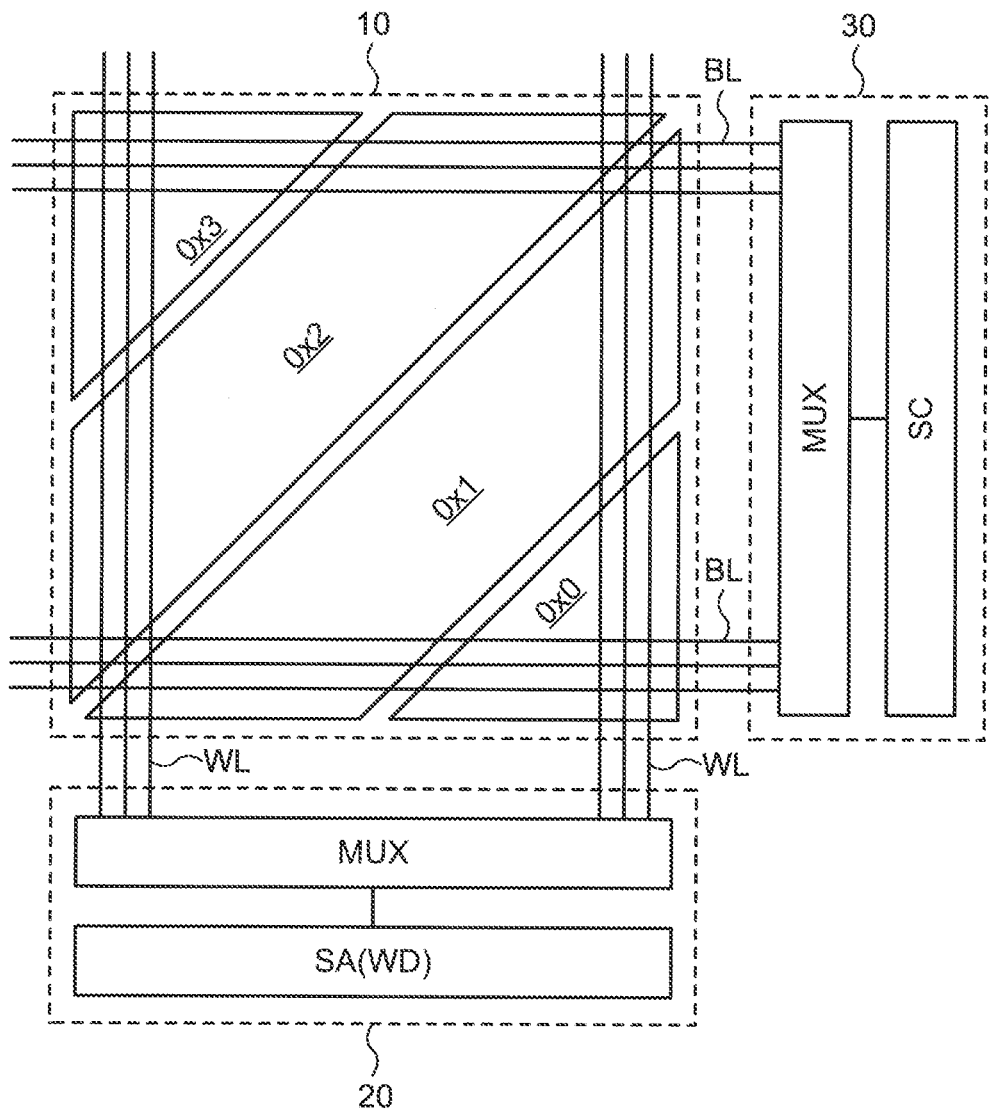
FIG. 2 is a block diagram showing a configuration of a nonvolatile memory and a peripheral circuit according to an embodiment.

FIG. 2 is a block diagram showing a configuration of a nonvolatile memory and a peripheral circuit according to an embodiment. As shown in FIG. 2, the non-volatile memory 10 is divided into four areas. The four areas are referred to as a first area 0x0, a second area 0x1, a third area 0x2, and a fourth area 0x3. In the present embodiment, the nonvolatile memory 10 is divided into the four areas described above according to the distance between the word line driving circuit 20 and the memory cell MC and the distance between the bit line driving circuit and the memory cell MC. The memory cell MC disposed in the first area 0x0 is a memory cell MC having a relatively short distance from the word line driving circuit 20 and the bit line driving circuit 30. The memory cell MC disposed in the fourth area 0x3 is a memory cell MC having a relatively long distance from the word line driving circuit 20 and the bit line driving circuit 30. The address of the memory cell MC determines the area to which the memory cell MC belongs. The area to which the memory cell MC belongs is determined by the setting information included in the above command.

The word line driving circuit 20 includes a multiplexer MUX, a sense amplifier SA, a write driving circuit WD, and the like. The bit line driving circuit 30 includes the multiplexer MUX and a condition setting circuit SC. Depending on the address specified by the command described above, the output of each multiplexer MUX is controlled. That is, the output from the multiplexer MUX is supplied to the bit line BL and the word line WL corresponding to the address specified by the command.

The condition setting circuit SC determines the condition of the writing operation or the reading operation in accordance with the setting information included in the command. In other words, the condition setting circuit SC is a circuit capable of performing the writing operation or the reading operation under the plurality of different conditions. In the present embodiment, the setting information is information related to the address. That is, the condition setting circuit SC determines the condition of the writing operation or the reading operation in accordance with the information related to the address included in the command. Specifically, the condition setting circuit SC determines the condition of the writing operation or the reading operation in accordance with the area in which the memory cell MC exists, wherein the memory cell MC is provided at the address specified by the command.

For example, the memory cell MC provided in the fourth area 0x3 has a relatively long distance from the word line driving circuit 20 and the bit line driving circuit 30 as compared with the memory cell MC provided in another area. Therefore, the voltage supplied to the memory cell MC provided in the fourth area 0x3 is lowered by the wiring resistance of the path. Therefore, it tends to be lower than the voltage supplied to the memory cell MC provided in the first area 0x0. Further, a path passing through the memory cell MC provided in the fourth area 0x3 has a larger parasitic capacitance than a path passing through the memory cell MC provided in another area. Therefore, there is a tendency that the signal supplied to the memory cell MC provided in the fourth area 0x3 is delayed from the memory cell MC provided in another area.

In order to eliminate such a tendency, the write voltage or the read voltage for the memory cell MC existing in the fourth area 0x3 is set higher than the write voltage or the read voltage for the memory cell MC existing in another area. Alternatively, the timing at which the write voltage or the read voltage is supplied to the memory cell MC existing in the fourth area 0x3 may be set to be earlier than the timing at which the write voltage or the read voltage is supplied to the memory cell MC existing in another area.

As described above, the write voltage or the read voltage for the memory cell MC existing in the second area 0x1 is set to be higher than the write voltage or the read voltage for the memory cell MC existing in the first area 0x0. The write voltage or the read voltage for the memory cell MC existing in the third area 0x2 is set to be higher than the write voltage or the read voltage for the memory cell MC existing in the first area 0x0 and the second area 0x1. By setting the write voltage or the read voltage as described above, it is possible to reduce the influence of the wiring resistance and the parasitic capacitance caused by the distance from the word line driving circuit 20 to the memory cell MC and the distance from the bit line driving circuit 30 to the memory cell MC.

Figure 3:
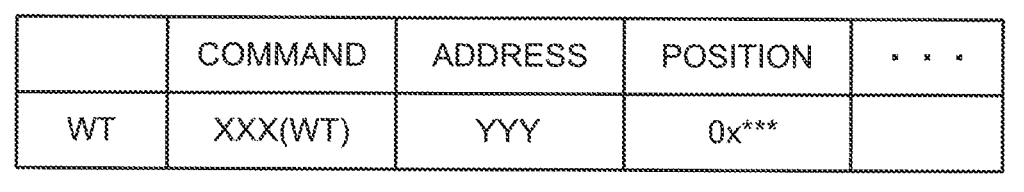

FIG. 3 is a diagram showing an example of a request signal transmitted from a host in a memory system according to an embodiment. A command shown in FIG. 3 is the write command. In the example of FIG. 3 "XXX (WT)" is transmitted from the host computer to the memory system 1 as a command (COMMAND). In the above command, "YYY" is specified as an address (ADDRESS). "0x * * *" is specified as position data (POSITION) corresponding to the addresses. Position information is an example of the "setting information". The "0x * * *" indicates any of the four areas shown in FIG. 2 (the first area 0x0, the second area 0x1, the third area 0x2, and the fourth area 0x3).

As described above, the setting information varies depending on the address of the memory cell MC of the access target. The memory controller 40 sets a different condition depending on the address according to the setting information, and performs the writing operation or the reading operation according to the set condition. One command may perform the writing operation or the reading operation to the memory cell MC provided in a different area. In such a case, depending on the address of the memory cell MC which is the access target in the command, the writing operation or the reading operation may be performed under the different conditions.

In the present embodiment, although the position information is set as the setting information, information other than the position information may be set as the setting information. For example, temperature information and time information may be set as the setting information. The command shown in FIG. 3 is only an example, and is not limited to the type and format of the command shown in FIG. 3.

1-3. Circuit Configuration of Condition Setting Circuit SC

Figure 4:
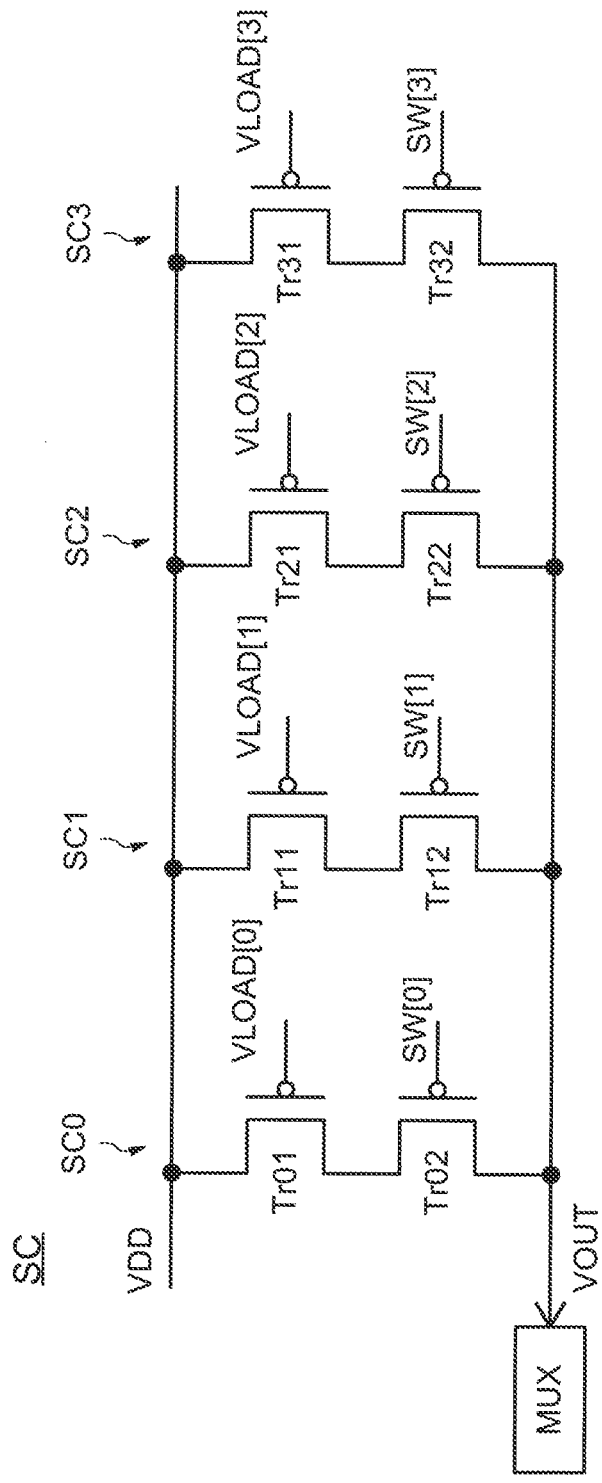
FIG. 4 is a diagram showing a condition setting circuit included in a memory system according to an embodiment.

FIG. 4 is a diagram showing a condition setting circuit included in the memory system according to an embodiment. As shown in FIG. 4, the condition setting circuit SC includes sub-circuits SC0 to SC3. The sub-circuits SC0 to SC3 are connected in parallel between a power supply line VDD and an output line VOUT. The sub-circuit SC0 comprises a drive transistor Tr01 and a switching transistor Tr02 connected in series. The sub-circuit SC1 comprises a drive transistor Tr11 and a switching transistor Tr12 connected in series. The sub-circuit SC2 comprises a drive transistor Tr21 and a switching transistor Tr22 connected in series. The sub-circuit SC3 comprises a drive transistor Tr31 and a switching transistor Tr32 connected in series.

Different control voltages (VLOAD [0], VLOAD [1], VLOAD [2], and VLOAD [3]) are supplied to gates of the drive transistors Tr01, Tr11, Tr21 and Tr31. That is, since the drive transistors Tr01, Tr11, Tr21, Tr31 flow different currents, the sub-circuits SC0 to SC3 output different voltages. Control signals (SW [0], SW [1], SW [2], SW [3]) for controlling the switching transistors Tr02, Tr12, Tr22, Tr32 to an on state (conductive state) or an off state (non-conductive state) are supplied to the gates of the switching transistors Tr02, Tr12, Tr22, Tr32. A control signal that controls a transistor to an on state is called an on signal, and a control signal that controls the transistor to an off state is called an off signal.

In a condition that the control voltages VLOAD [0], VLOAD [1], VLOAD [2], and VLOAD [3] are supplied to the drive transistor Tr01, Tr11, Tr21, Tr31, respectively, any one switching transistor of the switching transistors Tr02, Tr12, Tr22, Tr32 is controlled to the on state. That is, the on signal is supplied to any one of the control signals SW [0] to [3], and the off signal is supplied to the remaining control signal. For example, in the present embodiment, the control voltages VLOAD [0] to [3] are controlled so that the current flowing through the drive transistor is Tr01<Tr11<Tr21<Tr31.

The control voltages VLOAD [0] to [3] and the control signals SW [0] to [3] are determined based on the setting data included in the commands. That is, in the writing operation and the reading operation, the condition setting circuit SC can supply different currents and voltages corresponding to the setting information to the memory cell MC which is the access target.

As described above, the drive transistor and the switching transistor are connected in series between the power supply line VDD and the output line VOUT, and since the connection between the drive transistor and the output line VOUT is controlled by the switching transistor, the current and voltage supplied to the output line VOUT can be switched at high speed.

1-4. Operation Example of Non-Volatile Memory 10

Figure 5:
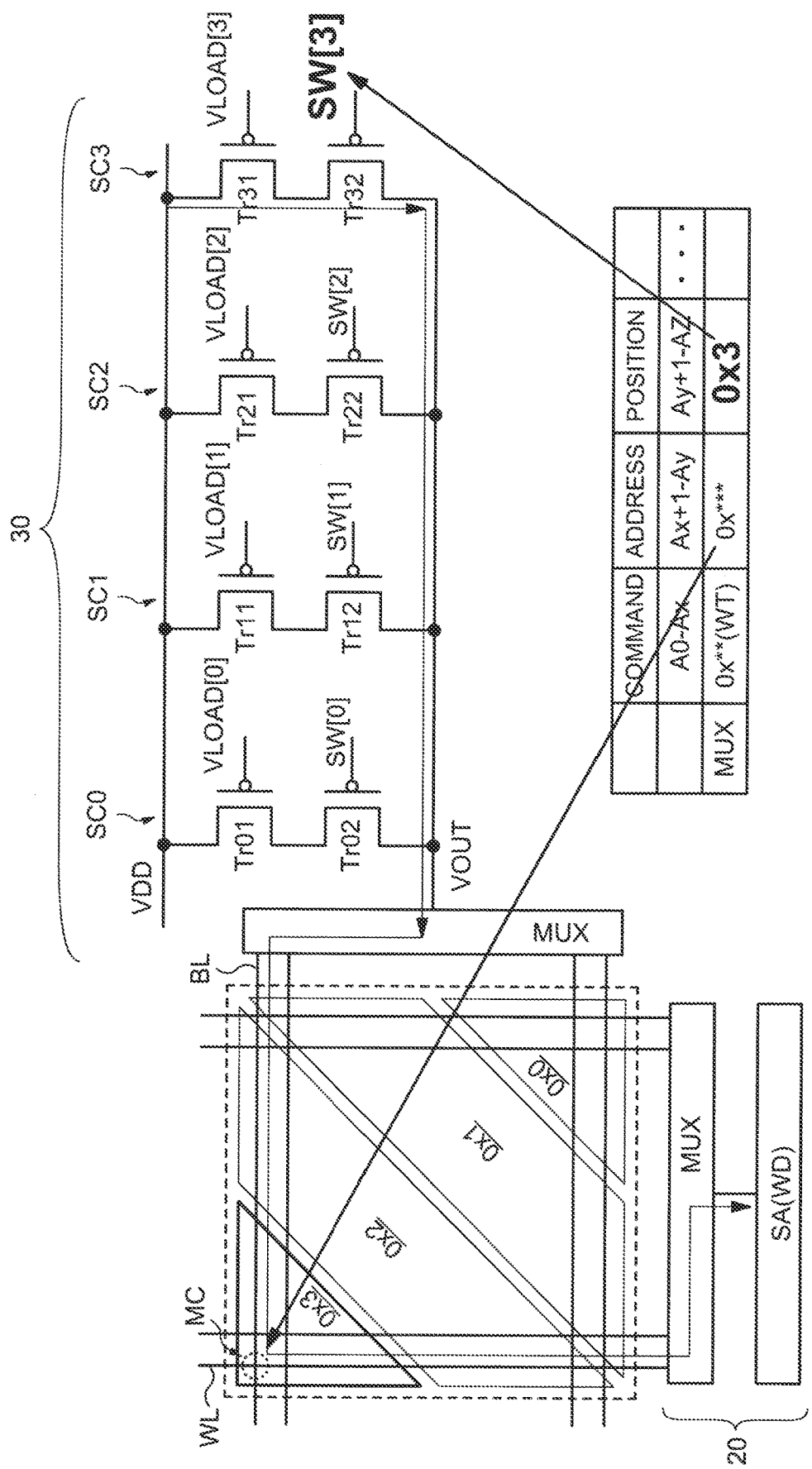
FIG. 5 is a diagram showing an example of an operation of a memory system according to an embodiment.

FIG. 5 is a diagram showing an example of an operation of a memory system according to an embodiment. In an operation example of FIG. 5, the writing operation is shown when the write request is received from the host computer and the write address specified by the command received from the host computer is the address of the memory cell MC included in the fourth area 0x3.

As shown in FIG. 5, the memory cell MC specified by the write address is provided at a position surrounded by a dotted circle among the positions where the bit line BL and the word line WL cross each other. Since the memory cell MC is provided in the fourth area 0x3, the wiring resistance of the path from the bit line driving circuit 30 to the word line driving circuit 20 in the memory cell MC is relatively higher than that of the memory cell MC provided in the first area 0x0, the second area 0x1, and the third area 0x2. Therefore, even when the same voltage is supplied from the bit line driving circuit 30, the voltage reaching the sense amplifier SA provided in the word line driving circuit 20 through the memory cell MC provided in the fourth area 0x3 becomes lower than the voltage reaching the sense amplifier SA through the memory cell MC provided in the other area.

In such cases, the sub-circuit SC3 is selected by the condition setting circuit SC based on the position information "0x3" included in the command. When the sub-circuit SC3 is selected, the voltage outputted from the drive transistor Tr31 is supplied to the memory cell MC. The current flowing through the drive transistor Tr31 is the largest among the drive transistors in the condition setting circuit SC. Therefore, even when the wiring resistance is high as described above, sufficient voltage reaches the sense amplifier SA. In other words, the above structure can reduce the influence of the wiring resistance in the writing operation or the reading operation. Therefore, it is possible to perform the writing operation (or the reading operation) to the non-volatile memory 10 under a condition suitable for an operation instructed by a command or the like.

In this embodiment, when the position information included in the command is "0x2", the sub-circuit SC2 is selected. When the position information included in the command is "0x1", the sub-circuit SC1 is selected. When the position information included in the command is "0x0", the sub-circuit SC0 is selected. The position information included in the command is determined according to the wiring resistance of the path from the bit line driving circuit 30 to the word line driving circuit 20.

In the present embodiment, although a configuration in which the non-volatile memory 10 is divided into four areas is exemplified, the present invention is not limited to this configuration. For example, the number of areas into which the non-volatile memory 10 is partitioned may be less than 4 or greater than 4. In the present embodiment, although the boundary of the adjacent area extends in a direction connecting the diagonal of the non-volatile memory 10, the boundary may extend in a direction different from FIG. 2. The boundaries of adjacent areas need not be linear.

In the present embodiment, although the configuration in which the condition setting circuit SC is provided with four sub-circuits SC0 to SC3 have been exemplified, the present embodiment is not limited to this configuration. For example, the number of the sub-circuits provided by the condition setting circuit SC may be less than 4, may be larger than 4. The number of the sub-circuits may be the same as or different from the number of the areas described above.

2. Second Embodiment

A memory system according to a second embodiment will be described with reference to FIG. 6. The memory system according to the second embodiment is similar to the memory system 1 according to the first embodiment. In the following description of the second embodiment, a description of the same configuration as that of the first embodiment is omitted, and points mainly different from the first embodiment will be described.

[2-1. Circuit Configuration of Condition Setting Circuit SC]

Figure 6:
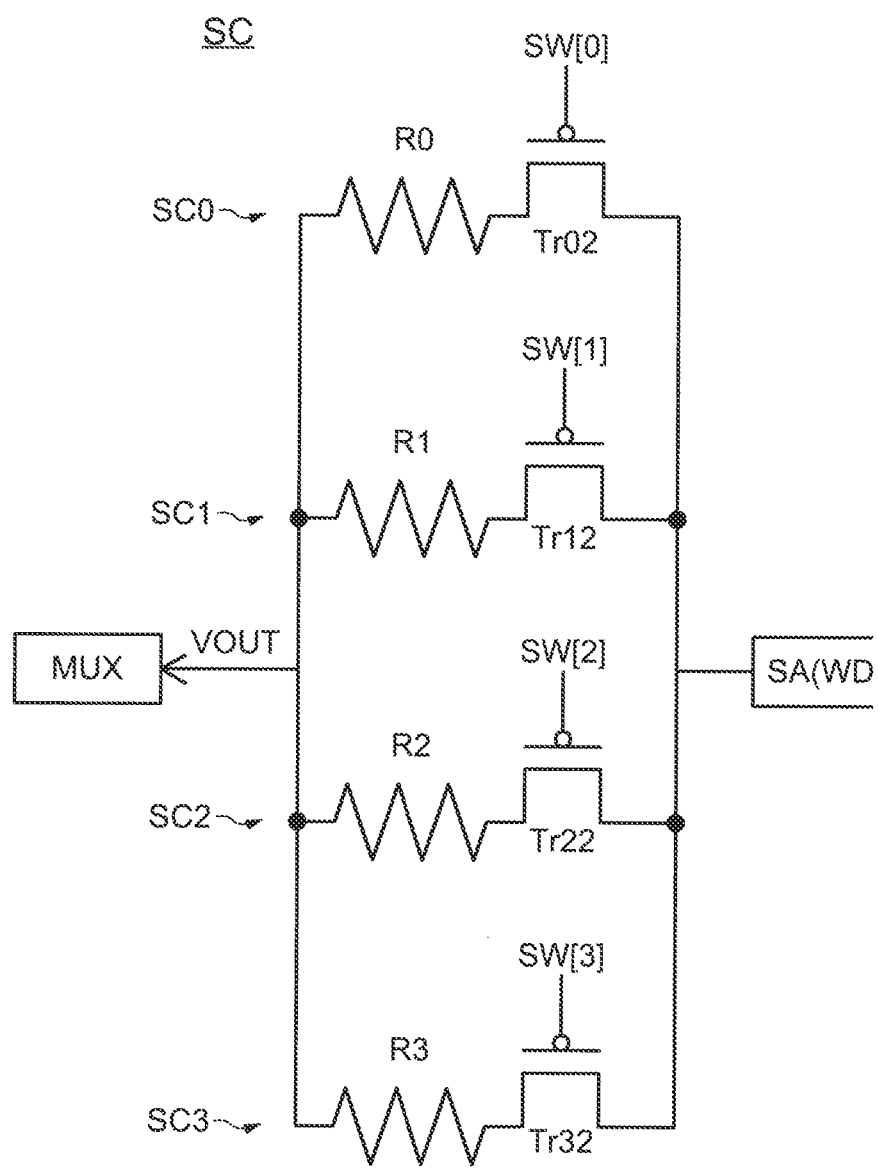
FIG. 6 is a diagram showing a condition setting circuit included in a memory system according to an embodiment.

FIG. 6 is a diagram showing a condition setting circuit included in a memory system according to an embodiment. As shown in FIG. 6, the condition setting circuit SC includes the sub-circuits SC0 to SC3. The sub-circuits SC0 to SC3 are connected in parallel between the sense amplifier SA (or the write driving circuit WD) and the output line VOUT. The sub-circuit SC0 comprises the switching transistor Tr02 and a resistance element R0 connected in series. The sub-circuit SC1 includes the switching transistor Tr12 and a resistance element R1 connected in series. The sub-circuit SC2 comprises the switching transistor Tr22 and a resistance element R2 connected in series. The sub-circuit SC3 includes the switching transistor Tr32 and a resistance element R3 connected in series. The resistance elements R0 to R3 have different resistance values, respectively. In the present embodiment, the magnitude of the resistance value is R0>R1>R2>R3.

When the sense amplifier SA or the write driving circuit WD is expressed as the control circuit for controlling the writing operation or the reading operation, it can be said that the condition setting circuit SC is provided between the control circuit and the non-volatile memory 10. That is, between the control circuit and the non-volatile memory 10, it can be said that the resistance elements having different resistance values are connected in parallel.

In this embodiment, when the position information included in the command is "0x0", the sub-circuit SC0 is selected. When the position information included in the command is "0x1", the sub-circuit SC1 is selected. When the position information included in the command is "0x2", the sub-circuit SC2 is selected. When the position information included in the command is "0x3", the sub-circuit SC3 is selected.

As described above, when the wiring resistance of the path from the bit line driving circuit 30 to the word line driving circuit 20 is relatively high (for example, when the writing operation or the reading operation is performed on the memory cell MC existing in the fourth area 0x3), the sub-circuit SC3 including the resistance element R3 having a relatively small resistance value is selected. On the other hand, when the wiring resistance described above is relatively low (for example, when the writing operation or the reading operation is performed on the memory cell MC existing in the first area 0x0), the sub-circuit SC0 including the resistance element R0 having a relatively large resistance value is selected. That is, the condition setting circuit SC of the present embodiment can connect loads (for example, resistances of wirings connected to the memory cells MC) which have different magnitudes to the memory cells MC which is the access target according to the setting information.

According to the above structure, the influence of the difference in wiring resistance caused by the position where the memory cell MC is provided in the reading operation or the writing operation can be reduced. Therefore, it is possible to perform the reading operation and the writing operation to the non-volatile memory 10 under the condition suitable for an operation instructed by a command or the like.

3. Third Embodiment

A memory system according to a third embodiment will be described with reference to FIG. 7. The memory system according to the third embodiment is similar to the memory system 1 according to the first embodiment. In the following description of the third embodiment, a description of the same configuration as that of the first embodiment is omitted, and points mainly different from the first embodiment will be described.

[3-1. Circuit Configuration of Condition Setting Circuit SC]

Figure 7:
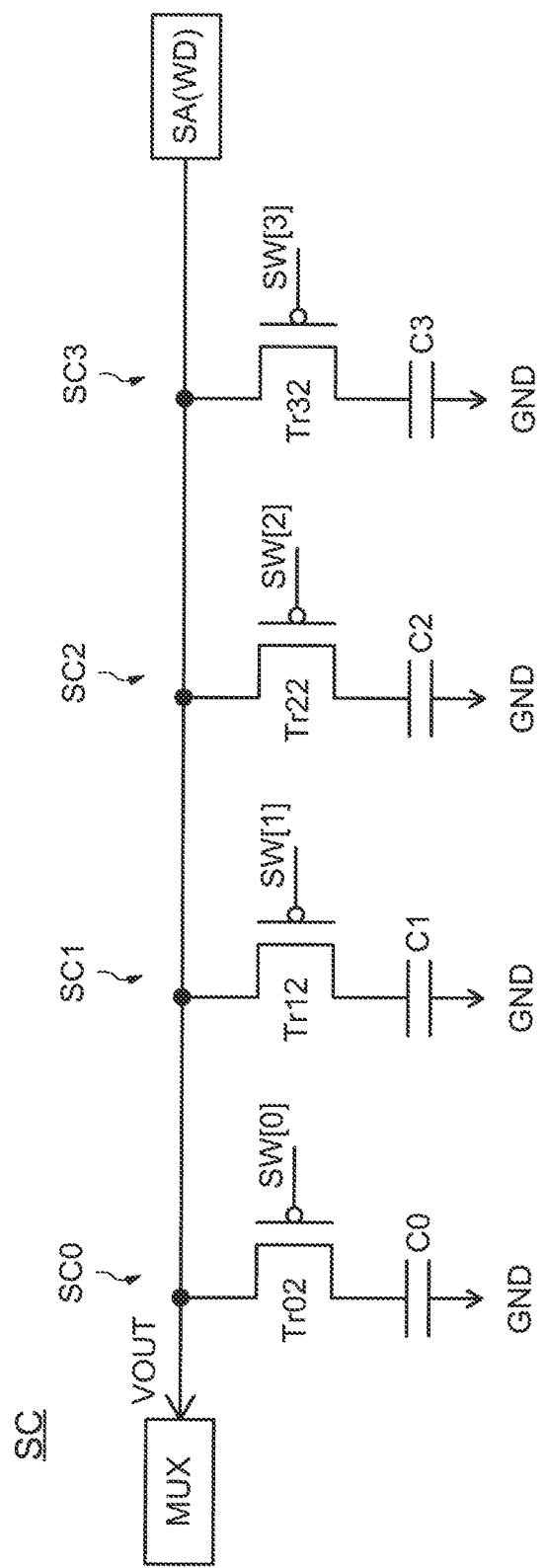
FIG. 7 is a diagram showing a condition setting circuit included in a memory system according to an embodiment.

FIG. 7 is a diagram showing a condition setting circuit included in the memory system according to an embodiment. As shown in FIG. 7, the condition setting circuit SC includes the sub-circuit SC0 to SC3.

The sub-circuits SC0 to SC3 are connected in parallel between the output line VOUT connected to the sense amplifier SA (or the write driving circuit WD) and a ground potential GND. The sub-circuit SC0 includes the switching transistor Tr02 and the capacitor C0 connected in series. The sub-circuit SC1 includes the switching transistor Tr12 and the capacitor C1 connected in series. The sub-circuit SC2 includes the switching transistor Tr22 and the capacitor C2 connected in series. The sub-circuit SC3 includes the switching transistor Tr32 and the capacitor C3 connected in series. The capacitance elements C0 to C3 have different capacitance values. In the present embodiment, the magnitude of the capacitance value is C0>C1>C2>C3.

When the sense amplifier SA or the write driving circuit WD is expressed as the control circuit for controlling the writing operation or the reading operation, it can be said that the condition setting circuit SC is provided between the control circuit and the non-volatile memory 10. That is, between the control circuit and the non-volatile memory 10, it can be said that the capacitance element having different capacitance values via the switching transistor is connected.

In this embodiment, when the position information included in the command is "0x0", the sub-circuit SC0 is selected. When the position information included in the command is "0x1", the sub-circuit SC1 is selected. When the position information included in the command is "0x2", the sub-circuit SC2 is selected. When the position information included in the command is "0x3", the sub-circuit SC3 is selected.

As described above, when the path from the bit-line driving circuit to the word line driving circuit 20 is long and the parasitic capacitance in the path is relatively large (for example, when the writing operation or the reading operation is performed on the memory cells MC existing in the fourth area 0x3), the sub-circuit SC3 including the capacitor C3 having a relatively small capacitance value is selected. On the other hand, when the parasitic capacitance is relatively small (for example, when the writing operation or the reading operation is performed on the memory cell MC existing in the first area 0x0), the sub-circuit SC0 including the capacitor C0 having a relatively large capacitance is selected. That is, the condition setting circuit SC of the present embodiment can connect loads (for example, parasitic capacitance in the path corresponding to the length of the path from the bit line driving circuit 30 to the word line driving circuit 20, and the like) which have different magnitudes to the memory cell MC which is the access target according to the setting information.

According to the above structure, the influence of the difference in parasitic capacitance caused by the position where the memory cell MC is provided in the reading operation or the writing operation can be reduced. Therefore, it is possible to perform the reading operation and the writing operation to the non-volatile memory 10 under the condition suitable for the operation instructed by the command or the like.

4. Fourth Embodiment

A memory system according to a fourth embodiment will be described with reference to FIG. 8. The memory system according to the fourth embodiment is similar to the memory system 1 according to the first embodiment. In the following description of the fourth embodiment, a description of the same configuration as that of the first embodiment is omitted, and points mainly different from the first embodiment will be described. As will be described in detail later, in the memory system according to the fourth embodiment, the section of the area in the writing operation is different from the section of the area in the reading operation.

[4-1. Circuit Configuration of the Non-Volatile Memory 10]

Figure 8:
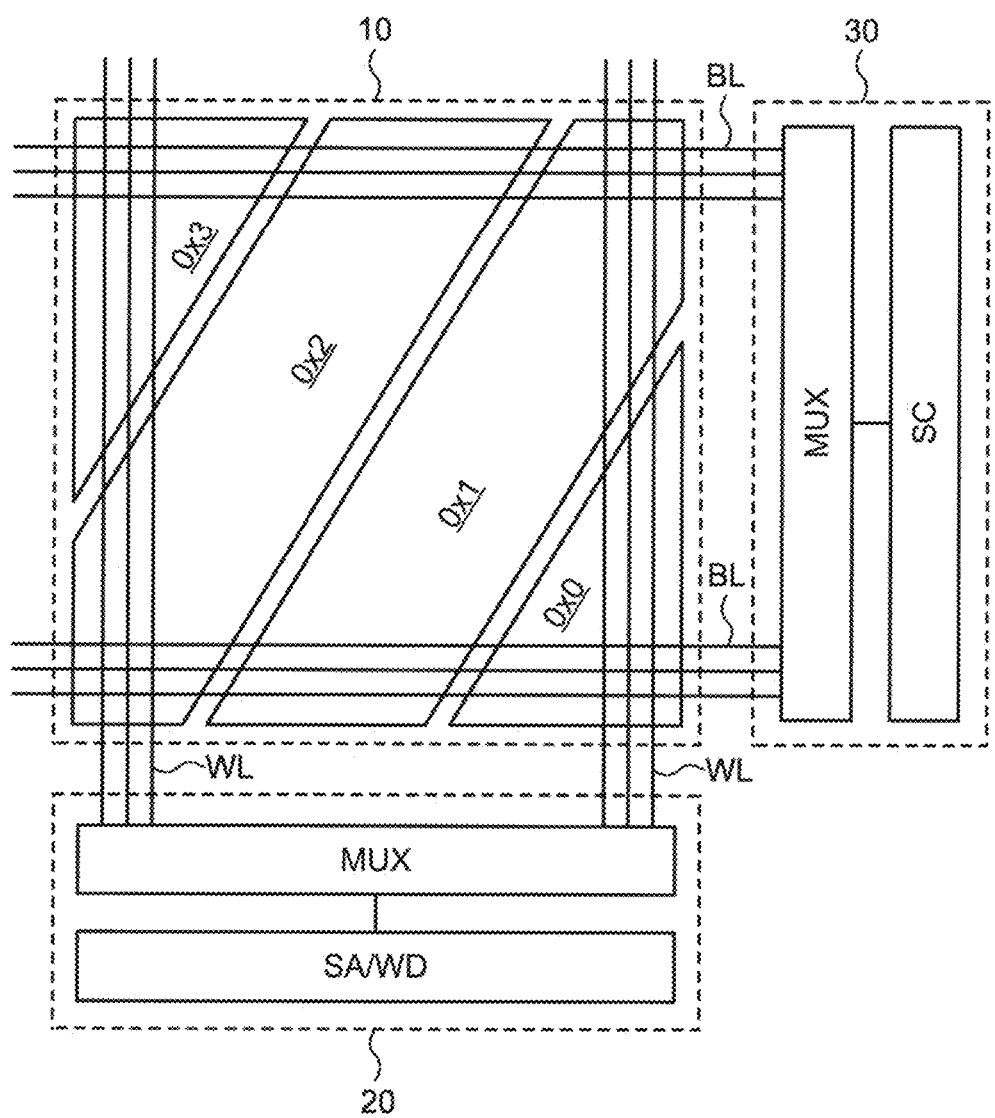
FIG. 8 is a block diagram showing a configuration of a non-volatile memory and a peripheral circuit according to an embodiment.

FIG. 8 is a block diagram showing an overall configuration of a non-volatile memory according to an embodiment. The section of the area shown in FIG. 8 is the section of the area in the writing operation. In the present embodiment, a division of the area in the reading operation is the same as the division of the area shown in FIG. 2. That is, in the fourth embodiment, in the case of the writing operation, the condition setting circuit SC is selected using the division of the area shown in FIG. 8, and in the case of the reading operation, the condition setting circuit SC is selected using the division of the area shown in FIG. 2. In other words, the area in which the writing operation is performed under the same condition according to the setting information and the area in which the reading operation is performed under the same condition according to the setting information are different.

The above-described division is realized by the allocation of the address and the position information of the memory cell MC in each of the writing operation and the reading operation. That is, for a particular memory cell MC, the setting information may be different depending on whether the operation requested by the command is the writing operation or the reading operation. For example, a specific memory cell MC may exist in the third area 0x2 in the case of the reading operation, but may exist in the fourth area 0x3 in the case of the writing operation.

Depending on the type of the memory element of the non-volatile memory 10, the condition required for the condition setting circuit SC may be different depending on the writing operation or the reading operation. Further, after the memory system 1 is put on the market, it is sometimes found that different conditions are required for the condition setting circuit SC in the writing operation or the reading operation as described above. Even in such a case, an operating condition based on the condition setting circuit SC can be controlled by the setting information included in the command.

5. Fifth Embodiment

A memory system according to a fifth embodiment will be described with reference to FIG. 9 to FIG. 12. The memory system according to the fifth embodiment is similar to the memory system 1 according to the first embodiment. In the following description of the fifth embodiment, description of the same configuration as that of the first embodiment is omitted, and points mainly different from the first embodiment will be described.

In the first to fourth embodiments described above, the memory system is shown in which the non-volatile memory 10 is divided into a plurality of areas and an operating condition is determined for each area. In contrast, in the memory system according to the fifth embodiment, the non-volatile memory 10 is not divided into areas, and the operating conditions are determined by external factors such as temperature or time, for example. That is, the setting conditions vary depending on the temperature or time.

FIG. 9 is a diagram showing an example of a command transmitted from the host in the memory system according to an embodiment. As shown in FIG. 9, the setting information (SETTING) which is different depending on the temperatures (Temp.) is set. In accordance with the setting information S0 to S3, for example, the sub-circuits SC0 to SC3 (see FIG. 4) of the condition setting circuit SC are operated. When the characteristics of the non-volatile memory 10 depend on the temperature, the setting information corresponding to the temperature is added to the command in accordance with information related to the temperature such as the external temperature acquired by the host computer, for example.

FIG. 10 is a diagram showing an example of a command transmitted from the host in the memory system according to an embodiment. As shown in FIG. 10, the setting information which is different depending on the time (Time) is set. In accordance with the setting information S0 to S3, for example, the sub-circuits SC0 to SC3 (see FIG. 4) of the condition setting circuit SC are operated. When the characteristics of the non-volatile memory 10 depend on time, the setting information corresponding to the time information is added to the command in accordance with, for example, time information acquired by the host computer. The time information is, for example, the time when the last writing operation was performed for the target memory cell MC. However, the time information is not limited to the above example, and various types of time information can be used.

FIG. 11 is a diagram showing an example of a command transmitted from the host in the memory system according to an embodiment. As shown in FIG. 11, the setting information which is different depending on the number of times of writing or the number of times of reading (Count) is set. In accordance with the setting information S0 to S3, for example, the sub-circuits SC0 to SC3 (see FIG. 4) of the condition setting circuit SC are operated. As the number of times of writing or reading increases, the characteristics of the non-volatile memory 10 tend to deteriorate. Therefore, the setting information corresponding to the number of times of writing or the number of times of reading the memory cell MC which is the access target is added to the command according to the number of the times. Information regarding the number of writing or reading may be stored, for example, in the non-volatile memory 10 or may be stored in a different storage device from the non-volatile memory 10 by the host computer.

FIG. 12 is a diagram showing an example of a command transmitted from the host in the memory system according to an embodiment. As shown in FIG. 12, the setting information which is different depending on the characteristics (Feature) of the memory cell MC is set. In accordance with the setting information S0 to S3, for example, the sub-circuits SC0 to SC3 (see FIG. 4) of the condition setting circuit SC are operated. After the memory system 1 is formed, the characteristics of the memory cells included in the non-volatile memory 10 may be evaluated. For example, a test pad is connected to a part of the memory cells MC included in the non-volatile memory 10, and the characteristics of the memory cells MC can be measured by directly applying a voltage to the test pad using a probe electrode. Alternatively, the characteristic of the memory cell MC included in the non-volatile memory 10 can be estimated from the result of the writing operation or the reading operation of the non-volatile memory 10. Depending on the characteristics of the memory cell MC acquired as described above, the setting information corresponding to the characteristics is added to the command.

The setting conditions according to temperature and time shown in the fifth embodiment may be applied to the first to fourth embodiments, respectively.

6. Sixth Embodiment

A memory system according to a sixth embodiment will be described with reference to FIG. 13 to FIG. 17. In the sixth embodiment, a detailed configuration of the memory cell MC will be described. The sixth embodiment can be applied to the first to fifth embodiments, respectively.

[6-1. Configuration of Non-Volatile Memory 10]

Figure 13:
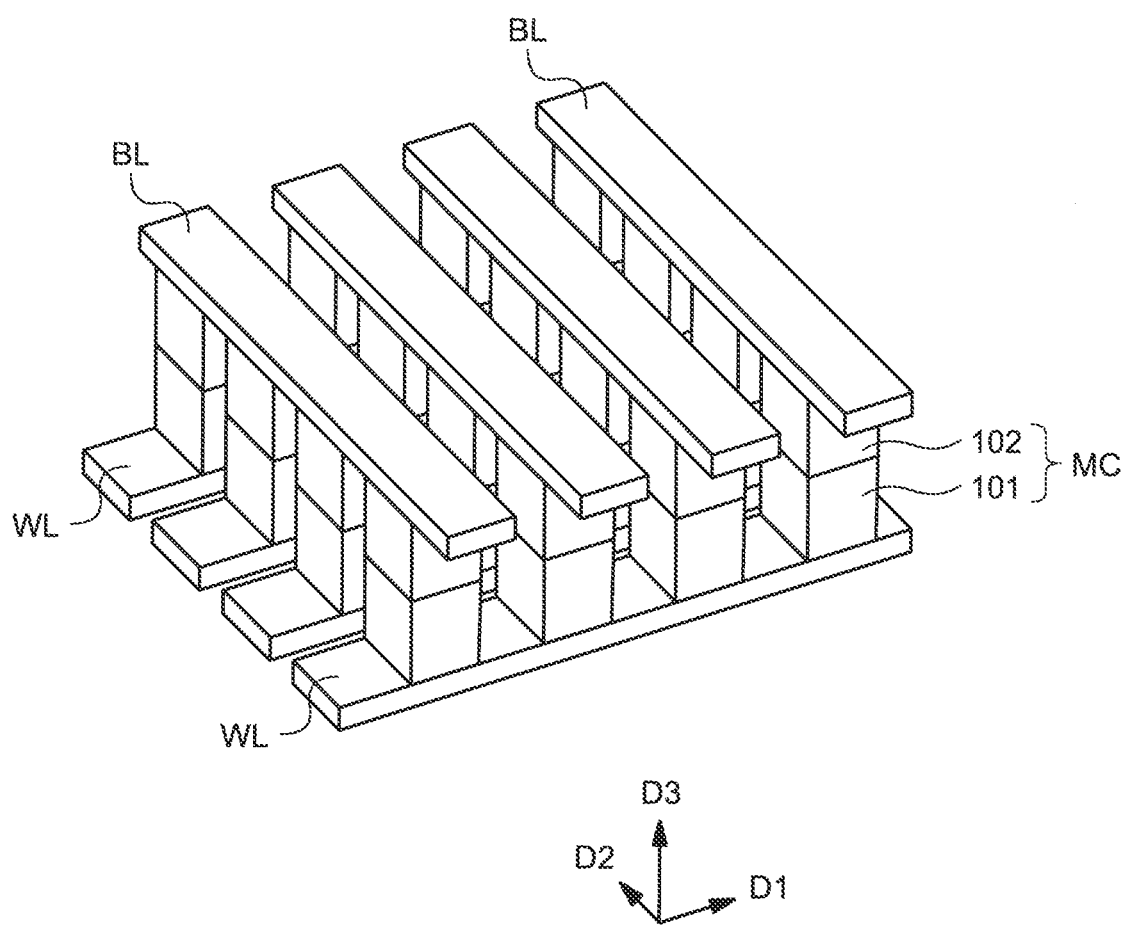
FIG. 13 is a perspective view schematically showing a configuration of a memory cell according to an embodiment.

FIG. 13 is a perspective view schematically showing a configuration of a memory cell according to an embodiment. As shown in FIG. 13, the memory cell MC is provided above the word line WL (D3 direction). The bit line BL is provided above the memory cell MC (the D3 direction). In other words, the memory cell MC is provided between the word line WL and the bit line BL in a region where the word line WL and the bit line BL provided in different layers intersect.

The memory cell MC includes a variable resistance element 101 and a switching element 102. The variable resistance element 101 and the switching element 102 are connected in series between the word line WL and the bit line BL. The variable resistance element 101 is provided on the word line WL side of the memory cell MC, and the switching element 102 is provided on the bit line BL side of the memory cell MC.

The variable resistance element 101 is a memory element that can be switched to the low-resistance state or the high-resistance state. The low-resistance state of the variable resistance element 101 may be referred to as a "first low-resistance state". The high-resistance state of the variable resistance element 101 may be referred to as a "first high-resistance state". In the present embodiment, a configuration in which a magnetoresistance effect element including a magnetic tunnel junction (MTJ) is used as the variable resistance element 101 will be described. Thereafter, the magnetoresistance effect element may be referred to as an MTJ element. The MTJ element is a memory element in which the resistance (tunnel resistance) due to a tunnel effect in an insulating layer varies according to the relationship (parallel or non-parallel) of a magnetization direction of each of two adjacent magnetic layers via the insulating layer. The MTJ element includes a plurality of resistance states (resistance values) which depend on the relative relationship between the direction of magnetization of one magnetic layer and the direction of magnetization of another magnetic layer (magnetization arrangement).

The switching element 102 is a two-terminal type element. The switching element is switched to the low-resistance state or the high-resistance state depending on the voltage applied to the two terminals. The switching element is a bidirectional switching element. By turning the switching element on or off, it is possible to perform control as to whether or not to supply a current to an MTJ element coupled to the switching element, namely, whether or not to select the MTJ element. The low-resistance state of the switching element 102 may be referred to as a "second low-resistance state". The high-resistance state of the switching element 102 may be referred to as a "second high-resistance state". The resistance in the second low-resistance state is lower than the resistance in the first low-resistance state of the variable resistance element 101 described above. The resistance in the second high-resistance state is higher than the resistance in the first high-resistance state of the variable resistance element 101 described above. That is, in the case where the switching element 102 is in the second high-resistance state, the resistance of the memory cell MC is substantially determined by the resistance of the switching element 102. On the other hand, in the case where the switching element 102 is in the second low-resistance state, the resistance of the memory cell MC is substantially determined by the resistance of the variable resistance element 101.

Unlike the configuration in FIG. 2, the variable resistance element 101 may be provided on the bit line BL side of the memory cell MC. The switching element 102 may be provided on the word line WL side of the memory cell MC. The word line WL may be provided above the switching element 102 (the D3 direction). The bit line BL may be provided below the variable resistance element 101 (the opposite direction of the D3 direction). Other members may be provided between the word line WL and the variable resistance element 101. Similarly, other members may be provided between the bit line BL and the switching element 102.

A variable resistance element other than the MTJ element may be used as the variable resistance element 101. For example, a magnetoresistive random access memory (MRAM), a resistive random access memory (ReRAM), a ferroelectric random access memory (FeRAM), an organic memory, and a phase-change memory element (PRAM) may be used as the variable resistance element 101.

[6-2. Configuration of MTJ Element]

Figure 14:
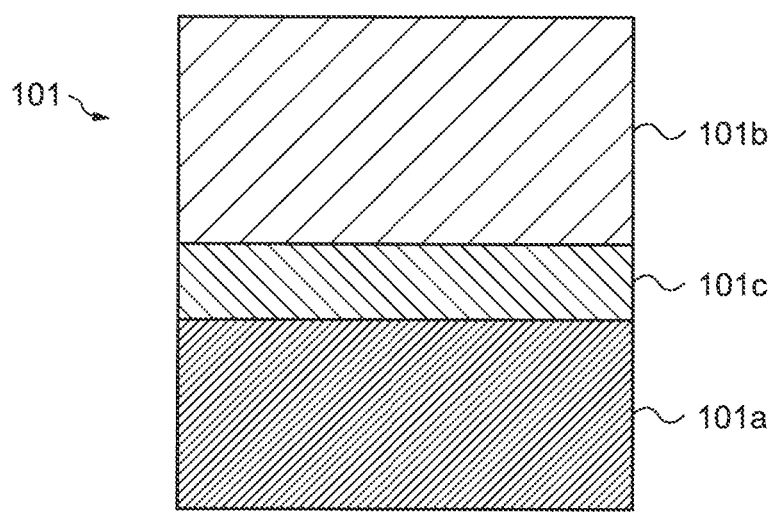
FIG. 14 is a cross-sectional view schematically showing a configuration of a variable resistance element according to an embodiment.
Figure 14:

FIG. 14 is a cross-sectional view schematically showing a configuration of a variable resistance element according to an embodiment. As shown in FIG. 14, the MTJ element used as the variable resistance element 101 includes a memory layer 101a, a reference layer 101b, and a tunnel barrier layer 101c. The memory layer 101a, the reference layer 101b and the non-magnetic layer 101c form the magnetic tunnel junction (MTJ). The memory layer 101a is a ferromagnetic layer having a first magnetism. The reference layer 101b is a ferromagnetic layer having a second magnetism. Examples of the memory layer 101a and the reference layer 101b include a ferromagnetic layer including (containing), for example, iron cobalt boron (FeCoB) or iron boride (FeB) etc. The tunnel barrier layer 101c is a non-magnetic layer. Examples of the tunnel barrier layer 101c include an insulation layer including (containing) oxygen and magnesium or magnesium oxide etc. The magnetization direction of the memory layer 101a is variable. The magnetization direction of the reference layer 101b is fixed. The magnetization direction of the memory layer 101a is changed by a write current supplied to the memory layer 101a. The magnetization direction of the memory layer 101a is determined by the direction of the write current. Further, the magnetization direction of the memory layer 101a is determined by a magnetic field provided from the outside of the non-volatile memory 10. On the other hand, the magnetization direction of the reference layer 101b is not changed even if the write current is supplied or the magnetic field is supplied to the reference layer 101b. The tunnel barrier layer 101c is an insulating layer.

In the case where the magnetization direction of the memory layer 101a is parallel to the magnetization direction of the reference layer 101b (in the case where the magnetization direction is the same direction), the MTJ element is in the low-resistance state. In the case where the magnetization direction of the memory layer 101a is antiparallel to the magnetization direction of the reference layer 101b (in the case where the magnetization directions are opposite), the MTJ element is in the high-resistance state. As described above, since the resistance state (low-resistance state or high-resistance state) is controlled by the magnetization direction of the memory layer 101a, binary data can be stored in the MTJ element based on the resistance state.

The memory layer 101a includes at least one of iron (Fe), cobalt (Co), and nickel (Ni). Further, the storage layer 101a may include boron (B). The reference layer 101b may include a lower layer portion and an upper layer portion. In this case, the lower layer portion includes Fe and Co. Further, the lower layer portion may have B. The upper layer portion includes at least one element selected from Co, platinum (Pt), nickel (Ni) and palladium (Pd). The tunnel barrier layer 101c includes, for example, oxygen and magnesium, or substantially includes magnesium oxide (MgO). A description comprising "substantially" means that the substantially formed material (composition) permits it to contain unintentional impurities.

Although a configuration of a bottom-free MTJ element in which the memory layer 101a provided below the reference layer 101b is used as the variable resistance element 101 is exemplified in FIG. 14, the present embodiment is not limited to this configuration. A top-free MTJ element in which the memory layer 101a is provided above the reference layer 101b may be used as the variable resistance element 101. The MTJ element may further include a shift canceling layer that cancels a magnetic field applied from the reference layer 101b to the memory layer 101a.

[6-3. Electrical Characteristics of Switching Element]

Figure 15:
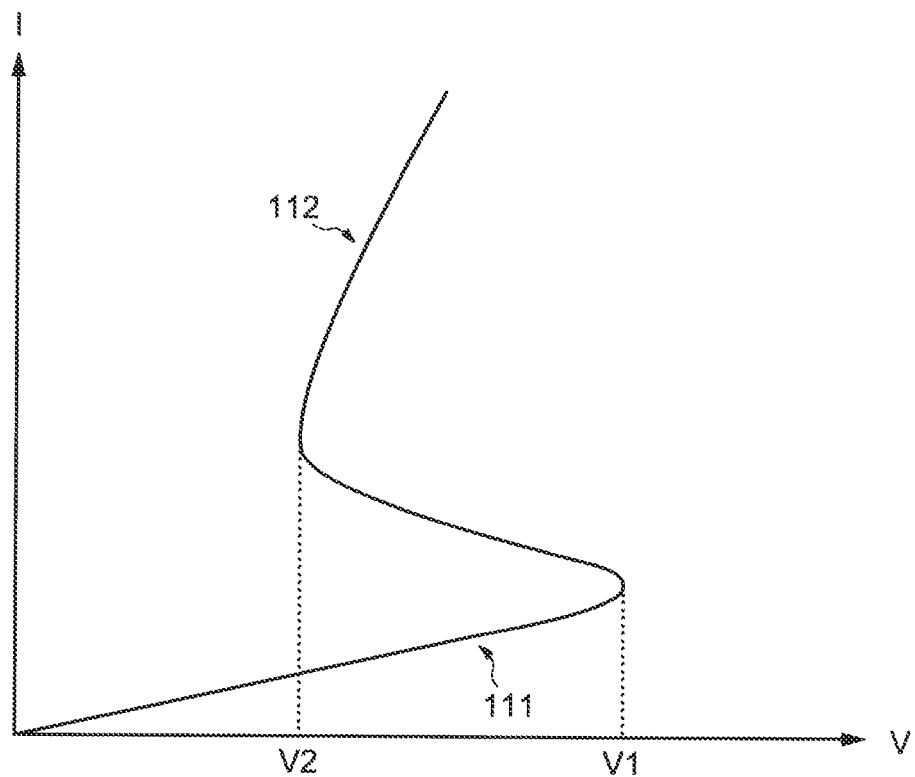
FIG. 15 is a diagram showing an electrical characteristic of a switching element according to an embodiment.

FIG. 15 is a diagram showing the electrical characteristics of the two-terminal type switching element according to an embodiment. Although the description of the operation of the switching element in the present embodiment will be described later, as in the electrical characteristic diagram of FIG. 15, a two-terminal type switching element is an example of the switching element of the present embodiment. The switching element has a characteristic that an applied voltage is rapidly lowered from a voltage V1 to a voltage V2, and the current increases according to the change of the voltage (snap back). The material composition used for the switching element having such characteristics is appropriately selected in accordance with the characteristics of the memory cell.

As shown in FIG. 15, when the voltage applied between the lower electrode 102a and the upper electrode 102b increases to reach the voltage V1, the switching element 102 is switched from the high-resistance state to the low-resistance state. That is, the electrical characteristics switch from the high-resistance mode 111 to the low-resistance mode 112 at a voltage V1. On the other hand, the switching element 102 is switched from the low-resistance state to the high-resistance state when the voltage applied between the electrodes decreases to reach the voltage V2.

By applying a predetermined voltage between the word line WL and the bit line BL to switch the switching element 102 to the low-resistance state, it is possible to perform the writing operation and the reading operation for the variable resistance element 101.

[6-4. Electrical Characteristics of Memory Cell MC]

Figure 16:
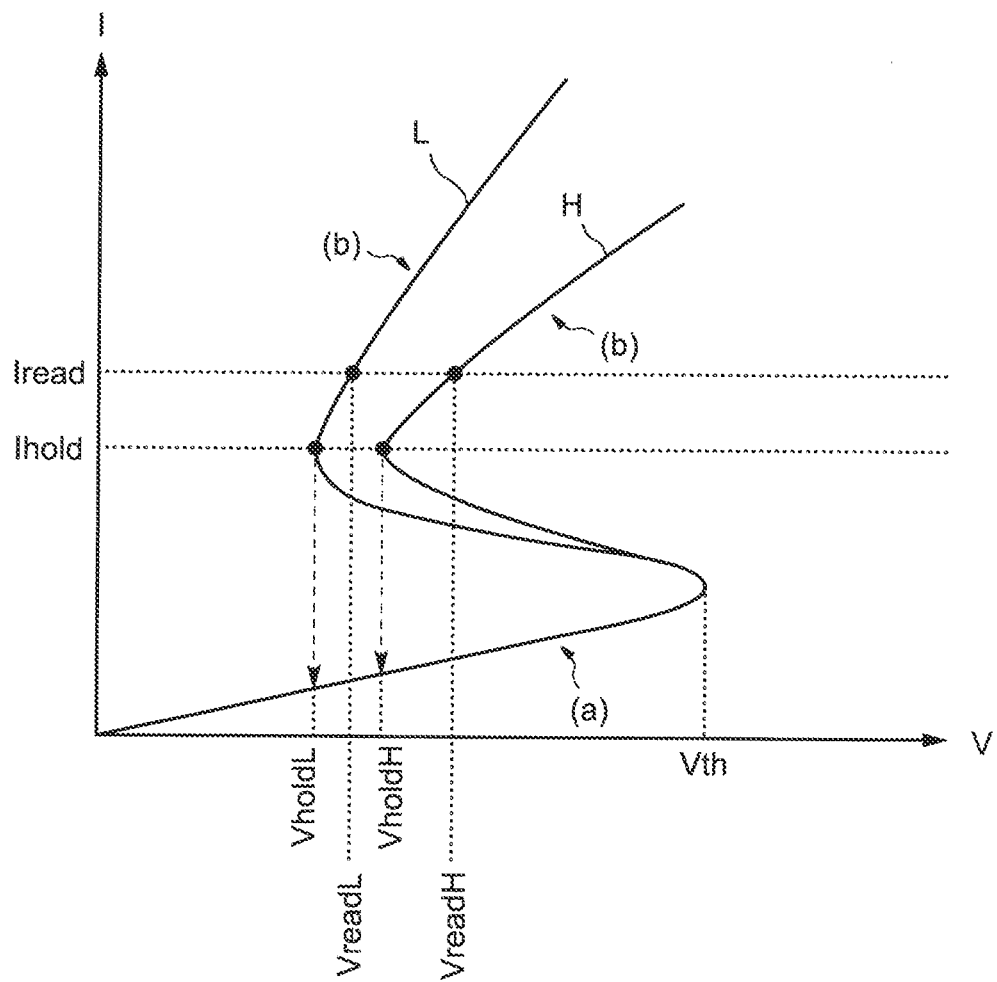
FIG. 16 is a diagram showing an electric characteristic of a memory cell according to an embodiment at the time of a reading operation.

FIG. 16 is a diagram schematically showing electrical characteristics of a selected memory cell MC when the reading operation is performed. In FIG. 16, the horizontal axis indicates the voltage between the two terminals of the selected memory cell MC (the voltage applied between the word line WL and the bit line BL), and the vertical axis indicates the current flowing through the selected memory cell MC. A characteristic (L) is a characteristic when the variable resistance element 101 is in the low-resistance state. A characteristic (H) is a characteristic when the variable resistance element 101 is in the high-resistance state. The electrical characteristics of the memory cell MC shown in FIG. 16 are electrical characteristics after the forming process.

As described above, the resistance of the switching element 102 in the high-resistance state after the forming process is sufficiently higher than the resistance of the variable resistance element 101 in the high-resistance state. In this case, the resistance of the memory cell MC is substantially determined by the resistance of the switching element 102. Therefore, the electrical characteristic (corresponding to a characteristic portion (a)) of the memory cell MC before the resistance state of the switching element 102 is switched from the high-resistance state to the low-resistance state is substantially the same even when the variable resistance element 101 is in the low-resistance state or the high-resistance state. That is, if it is after the forming process, there is substantially no difference in the voltage (threshold voltage Vth) applied between the two terminals of the memory cell MC when the resistance state of the switching element 102 is switched from the high-resistance state to the low-resistance state regardless of whether the switching element 102 is in the low-resistance state or the high-resistance state.

On the other hand, since the resistance of the switching element 102 in the low-resistance state is lower than the resistance of the variable resistance element 101 in the low-resistance state, the resistance of the memory cell MC is strongly affected by the resistance of the variable resistance element 101 after the switching element 102 is switched from the high-resistance state to the low-resistance state. Therefore, in the electrical characteristic (corresponding to a characteristic portion (b)) of the memory cell MC after the resistance state of the switching element 102 is switched from the high-resistance state to the low-resistance state, the electrical characteristic in the case where the variable resistance element 101 is in the low-resistance state differs from the electrical characteristic in the case where the variable resistance element 101 is in the high-resistance state. Specifically, for the voltage-current gradient in the characteristic portion (b), the gradient (characteristic (H)) in the case where the variable resistance element 101 is in the high-resistance state is smaller than the gradient (characteristic (L)) in the case where the variable resistance element 101 is in the low-resistance state.

As shown in FIG. 16, with respect to a read current Iread in the reading operation, the read voltage in the case where the variable resistance element 101 is in the low-resistance state is VreadL, and the read voltage in the case where the variable resistance element 101 is in the high-resistance state is VreadH. The read voltage VreadL is smaller than the read voltage VreadH. Based on the difference between the read voltage VreadL and the read voltage VreadH, it is possible to discriminate the resistance state of the variable resistance element 101 (the low-resistance state or the high-resistance state).

In FIG. 16, a hold current Ihold is a current flowing through the memory cell MC when the switching element 102 is switched from the low-resistance state to the high-resistance state. A hold voltage Vhold is a voltage applied between the two terminals of the memory cell MC when the hold current Ihold flows through the memory cell MC. The hold voltage in the case where the variable resistance element 101 is in the low-resistance state is VholdL. The hold voltage in the case where the variable resistance element 101 is in the high-resistance state is VholdH. Unless the hold voltages VholdL and VholdH are specifically distinguished, they are simply referred to as the hold voltage Vhold.

In the case of performing the reading operation, the bit line BL connected to the memory cell MC to be read is charged, the potential of the word line WL is changed, and the potential difference between the bit line BL and the word line WL is set to Vth or more, whereby the switching element 102 is switched from the high-resistance state to the low-resistance state. When the switching element 102 is switched to the low-resistance state, the electrical charge held in the bit line BL flows to the word line WL via the memory cell MC, and the potential of the bit line BL is lowered.

When the potential of the bit line BL is smaller than the hold voltage Vhold, the switching element 102 is switched from the low-resistance state to the high-resistance state, and the potential of the bit line BL is stabilized. When the variable resistance element 101 is in the low-resistance state, the potential of the bit line BL is stabilized at the holding voltage VholdL. When the variable resistance element 101 is in a high-resistance state, the potential of the bit line BL is stabilized at the hold-voltage VholdH. By detecting the potential of the bit line BL, it is possible to detect the resistance state of the variable resistance element 101.

[6-5. Functional Configuration of Discrimination Circuit]

Figure 17:
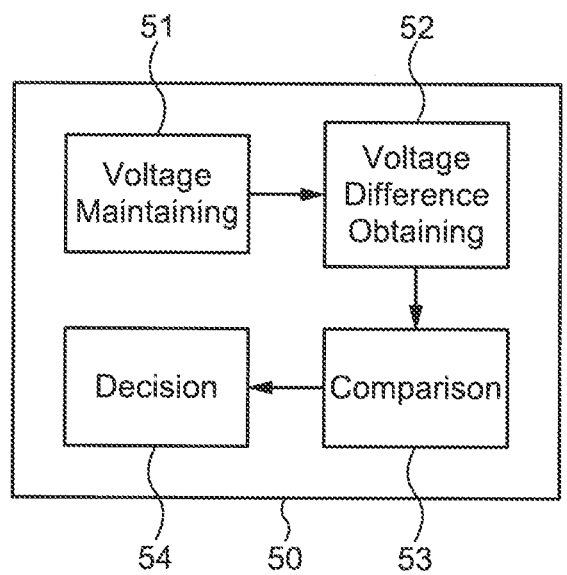
FIG. 17 is a block diagram showing a functional configuration of a determination circuit included in a memory system according to an embodiment.

FIG. 17 is a block diagram showing a functional configuration of a discrimination circuit included in a memory system according to an embodiment. As shown in FIG. 17, the discrimination circuit 50 includes a voltage maintaining unit 51 (Voltage Maintaining), a voltage difference obtaining unit 52 (Voltage Difference Obtaining), a comparison unit 53 (Comparison), and a discrimination unit 54 (Discrimination).

The voltage maintaining unit 51 holds the read voltage (VreadL or VreadH) obtained by the reading operation of the memory cell MC as a determination target voltage. As described above, the reading operation of the data stored in the memory cell MC may be referred to as a "first reading operation". The determination target voltage may be referred to as a "first target voltage".

Further, the voltage maintaining unit 51 holds a reference voltage for performing data discrimination on the discrimination target voltage. The reference voltage is obtained by a second reading operation performed after the first reading operation. The reference voltage may be referred to as a "second target voltage". The writing operation to the variable resistance element 101 is performed after the first reading operation described above. The second reading operation is performed after the variable resistance element 101 is switched to the low-resistance state or high-resistance state. The resistance state of the variable resistance element 101 when the first reading operation is performed may be referred to as a "discrimination target resistance state", and the resistance state of the variable resistance element 101 when the second reading operation is performed may be referred to as a "reference resistance state".

The voltage difference obtaining unit 52 obtains a voltage difference between the discrimination target voltage and the reference voltage held by the voltage maintaining unit 51.

The comparison unit 53 compares the voltage difference obtained by the voltage difference obtaining unit 52 and the reference voltage difference. The reference voltage difference is, for example, a value obtained by multiplying the voltage difference between the read voltage VreadL in the case where the variable resistance element 101 is in the low-resistance state and the read voltage VreadH in the case where the variable resistance element 101 is in the high-resistance state by ½.

The discrimination unit 54 discriminates the resistance state of the variable resistance element 101 based on the comparison result obtained by the comparison unit 53. Specifically, in the case where the voltage difference between the discrimination target voltage and the reference voltage is smaller than the reference voltage difference, it is discriminated that the discrimination target resistance state of the variable resistance element 101 is the same as the reference resistance state. In the case where the voltage difference between the discrimination target voltage and the reference voltage is greater than the reference voltage difference, it is discriminated that the discrimination target resistance state of the variable resistance element 101 is a resistance state that differs from the reference resistance state. The discrimination circuit mentioned above is merely an example, and a discrimination of the data stored in the memory cell MC may be performed using a discrimination circuit other than the discrimination circuit mentioned above. For example, the discrimination of data stored in the memory cell MC may be performed directly from the read voltage without using the reference voltage.

While the present invention has been described with reference to the accompanying drawings, the present invention is not limited to the above embodiments, and can be appropriately modified without departing from the spirit of the present invention. For example, a memory system of the present embodiment to which a person skilled in the art adds, deletes, or changes the design of components as appropriate based on the memory system of the present embodiment is also included in the scope of the present invention as long as the spirit of the present invention is provided. Furthermore, the embodiments described above can be appropriately combined as long as there is no mutual inconsistency, and technical matters common to the embodiments are included in the embodiments even if they are not explicitly described.

Even if it is other working effects which are different from the working effect brought about by the mode of each above-mentioned embodiment, what is clear from the description in this specifications, or what can be easily predicted by the person skilled in the art is naturally understood to be brought about by the present invention.

What is claimed is:

1. A memory system comprising:
a non-volatile memory; and
a memory controller configured to receive a command including an access target in the non-volatile memory and setting information from a host computer, and to control a writing operation or a reading operation to the access target,
wherein:
the memory controller has a condition setting circuit,
the condition setting circuit is configured to determine a condition of the writing operation or the reading operation based on the setting information received from the host computer, and
the memory controller performs the writing operation or the reading operation based on the determined condition.

2. The memory system according to claim 1, wherein the condition setting circuit is configured to supply different currents to the access target in accordance with the setting information in the writing operation or the reading operation.

3. The memory system according to claim 1, wherein the condition setting circuit is configured to connect, to the access target, different voltage loads having different voltage magnitudes, different resistance loads having different resistance magnitudes, or different capacitance loads having different capacitance magnitudes, in accordance with the setting information.

4. The memory system according to claim 1, further comprising a control circuit configured to control the writing operation or the reading operation,
wherein the condition setting circuit has a structure in which resistance elements having different resistances are connected in parallel between the control circuit and the non-volatile memory.

5. The memory system according to claim 1, further comprising a control circuit configured to control the writing operation or the reading operation, wherein the condition setting circuit has a structure in which capacitance elements having different capacitances are connected between the control circuit and the non-volatile memory.

6. The memory system according to claim 1, wherein:
the setting information differs based on an address of the access target, and
the memory controller is configured to perform the writing operation or the reading operation under different conditions in accordance with the address based on the setting information.

7. The memory system according to claim 1, wherein an area in which the writing operation is performed under a same condition based on the setting information is different from an area in which the reading operation is performed under a same condition based on the setting information.

8. The memory system according to claim 1, wherein:
the setting information differs according to temperature, and
the memory controller is configured to perform the writing operation or the reading operation under different conditions based on the setting information.

9. The memory system according to claim 1, wherein;
the setting information differs according to time, and
the memory controller is configured to perform the writing operation or the reading operation under different conditions based on the setting information.

10. The memory system according to claim 1, wherein:
the setting information differs according to a number of the writing operation or the reading operation to the access target, and
the memory controller is configured to perform the writing operation or the reading operation under different conditions based on the setting information.

11. The memory system according to claim 1, wherein:
the setting information differs according to a characteristic of a memory cell corresponding to the access target, and
the memory controller is configured to perform the writing operation or the reading operation under different conditions based on the setting information.

* * * * *